(12) United States Patent
Nakamura et al.

(10) Patent No.: US 6,518,617 B1
(45) Date of Patent: Feb. 11, 2003

(54) NONVOLATILE SEMICONDUCTOR MEMORY DEVICE

(75) Inventors: Akihiro Nakamura, Kanagawa (JP); Yutaka Hayashi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 08/985,278

(22) Filed: Dec. 4, 1997

(30) Foreign Application Priority Data

Dec. 31, 1996 (JP) ............................................. 08-357562
May 28, 1997 (JP) ............................................. 09-138965

(51) Int. Cl.[7] ..................... H01L 29/76; H01L 29/788; H01L 29/792
(52) U.S. Cl. ......................................... 257/314; 257/324
(58) Field of Search ................................. 257/314–325, 257/411; 438/257–266, 591; 365/185.01–185.05, 185.18

(56) References Cited

U.S. PATENT DOCUMENTS

| | | | | |
|---|---|---|---|---|
| 4,868,632 A | * | 9/1989 | Hayashi et al. | 257/411 |
| 5,311,049 A | | 5/1994 | Tsuruta | |
| 5,324,675 A | * | 6/1994 | Hayabuchi | 438/591 |
| 5,511,020 A | * | 4/1996 | Hu et al. | 365/185.18 |
| 5,521,590 A | | 5/1996 | Hanaoka et al. | |
| 5,621,683 A | * | 4/1997 | Young | 365/185.05 |
| 5,668,756 A | * | 9/1997 | Tomioka | 365/185.03 |

FOREIGN PATENT DOCUMENTS

| | | |
|---|---|---|
| EP | 0 597 124 A1 | 5/1994 |
| EP | 597 124 | 5/1994 |
| GB | 2 013 397 | 8/1979 |
| GB | 2 013 397 A | 8/1979 |
| GB | 2 207 553 | 2/1989 |
| GB | 2 207 553 A | 2/1989 |
| JP | 03257935 | 11/1991 |
| JP | 06296028 | 10/1994 |

OTHER PUBLICATIONS

European Search Report dated Feb. 21, 2000.

* cited by examiner

*Primary Examiner*—Cuong Quang Nguyen
(74) *Attorney, Agent, or Firm*—Rader, Fishman, & Grauer PLLC; Ronald P. Kananen, Esq.

(57) ABSTRACT

A nonvolatile semiconductor memory device comprises of a channel-forming region of a semiconductor on which a tunnel film, a nitride film, and a top oxide film are laminated between a gate electrode in order from the lower layer. The thickness T of the tunnel film is within a range where charges in the substrate directly tunnel through the tunnel film and is 2.2 (preferably 3.4) nm or more. In this case, the thickness of the top oxide film is set up to thinner than the conventional thickness in order to make the amount of transition of carriers passing through the top oxide equal to or more than the amounts of transition of carriers passing through the tunnel film in a read operation. Preferably, the top oxide film is thinner than the tunnel film. Further, the nitride film has a higher silicon content than the stoichiometric ratio thereof (Si:N=3:4).

8 Claims, 11 Drawing Sheets

SECTIONAL VIEW OF MONOS TYPE NONVOLATILE MEMORY DEVICE OF AN EMBODIMENT

SECTIONAL VIEW OF MONOS TYPE NONVOLATILE MEMORY DEVICE OF AN EMBODIMENT

GRAPH SHOWING HYSTERESIS OF NONVOLATILE MEMORY DEVICE

VIEW SHOWING RELATIONSHIP BETWEEN VOLTAGE APPLICATION TIME AND THRESHOLD VOLTAGE IN NONVOLATILE MEMORY DEVICE

SECTIONAL VIEW OF MNOS TYPE NONVOLATILE MEMORY DEVICE OF EMBODIMENT

SECTIONAL VIEW OF CONVENTIONAL MONOS TYPE
NONVOLATILE MEMORY DEVICE

NONVOLATILE SEMICONDUCTOR MEMORY DEVICE

BACKGROUND OF THE INVENTION

1. Field of the Invention

The present invention relates to a nonvolatile semiconductor memory device, more particularly relates to a nonvolatile memory device comprised of a channel-forming region comprising a surface portion of a semiconductor substrate, a well, semiconductor film or other on which a tunnel film, an insulation film, and a gate electrode are laminated in order from the lower layer.

2. Description of the Related Art

In an MNOS (Metal-Nitride-Oxide Semiconductor) type or MONOS (Metal-Oxide-Nitride-Oxide Semiconductor) type nonvolatile memory device (hereinafter also referred to as a "MIOS type"), the gate electrode is comprised of a single layer and thus has a simpler element structure in comparison with a floating gate (hereinafter described as an FG) type nonvolatile memory device in which the gate electrode has a two-layer structure.

FIG. 11 is a sectional view of a MONOS type nonvolatile memory device. As shown in this figure, the MONOS type nonvolatile memory device 6 is structured of a channel-forming region 11a of a semiconductor substrate 11 on which a tunnel film 12 made of a silicon oxide film or an oxi-nitride film, etc., an insulation film 13 comprising a silicon nitride film 13a and a silicon oxide film 13b as the upper layer thereof, and a gate electrode 14 are laminated in order from the lower layer. The term "channel-forming region" in the present invention means a region where a channel through which electrons or positive holes pass is formed. Various forms exist, for example, a surface part of a semiconductor substrate per se, a surface part of a well formed in the surface of a semiconductor substrate and a semiconductor film.

In the tunnel film 12 in a MONOS type nonvolatile memory device, the thickness thereof is important in terms of determining the characteristics of a memory element. For example, mentioning one example, in Cheng Wang, "Hot Carrier Design Consideration for MOS Devices and Circuits", p. 219, the thickness of the tunnel film 12 is set within a range of T=1.5 nm to 2.0 nm or so. The same is true for an MNOS type nonvolatile memory device in which the insulation film 13 is made of a single layer of silicon nitride film 13a.

The thickness of the tunnel film 12 is a thin one of about ⅕ the thickness of the tunnel oxide film in an FG type nonvolatile memory device.

Further, in these MIOS type nonvolatile memory devices, since the thickness of the tunnel film 12 is thin as described above, injection of charges at a lower gate voltage in comparison with an FG type nonvolatile memory device is possible and the write characteristic is excellent.

However, a MIOS type nonvolatile memory device was inferior in its data retention characteristic to an FG type nonvolatile memory device. In general, the period of guarantee of the data retention in an FG type nonvolatile memory device is 10 years at 125° C. As opposed to this, the period of guarantee of the data retention in a MIOS type nonvolatile memory device is 10 years at 85° C.

Further, in an MIOS type nonvolatile memory device, the write characteristics at a low voltage were excellent as mentioned above, but there was a problem of a read disturbance, that is, charges were accumulated in the insulation film at a low gate voltage at the time of a read operation and erroneous writing occurred. For this reason, by adopting a two-transistor structure in which selection transistors are individually provided for every memory element, occurrence of erroneous writing due to read disturbances has been prevented. Accordingly, in a conventional MIOS type nonvolatile memory device, in comparison with an FG type nonvolatile memory device in which it is not necessary to provide a selection transistor for every memory element, the cell area became 1.5 times or more the size.

SUMMARY OF THE INVENTION

The present invention was made in consideration with such an actual circumstance and has as an object thereof to provide a nonvolatile semiconductor memory device in which the data retention characteristic and the resistance to read disturbances are improved. Further, another object of the present invention is to realize a so-called one-transistor cell structure without providing a selection transistor by improving the resistance to read disturbances, preferably, further, by forming the memory element as an enhancement type.

To achieve the above object, the present invention provides a nonvolatile semiconductor memory device comprised of a channel-forming region of a semiconductor on which a tunnel film, an insulation film, and a gate electrode are laminated in order from the lower layer, wherein the thickness of the tunnel film is within a range where charges in the semiconductor substrate directly tunnel through the tunnel film and is 2.2 nm or more, thereby forming a one-transistor cell structure.

In the nonvolatile semiconductor memory device, although the thickness of the tunnel film is set within the range where the charges in the channel-forming region directly tunnel through the tunnel film, charges are injected into the insulation film by the mechanism of modified F-N (Fowler-Nordheim) tunneling similar to the conventional one. Further, since the thickness of the tunnel film is greater in comparison with a conventional MIOS type nonvolatile memory device, i.e., 2.2 nm or more, this tunnel film acts as a barrier, it becomes difficult for the charges injected into the insulation film to leak into the semiconductor substrate, and the data retention characteristic is improved. Along with this, it becomes difficult for the charges to be injected into the insulation film at a low gate voltage at the time of a read operation.

Further, in the nonvolatile memory device, the characteristic feature resides in that the insulation film has a higher content of silicon than the stoichiometric ratio $Si_3N_4$ (Si:N= 3:4).

By constituting the insulation film by silicon nitride having a high content of silicon as described above, a trap density of charges in the insulation film is increased, and the conductivity of the insulation film become s high. For this reason, when voltage is applied to the gate electrode, a stronger electric field is applied with respect to the tunnel film, thus the increase of the application voltage at the time of a write/erase operation can be suppressed low by making the tunnel film thicker than the conventional thickness.

On the other hand, in order to make it difficult for a read disturbance to arise, in a MONOS type nonvolatile memory device, the top oxide thickness may be made thin within a range where the amount of the required change of the threshold voltage at the time of a write operation is obtained.

In this case, the insulation film of the present invention is constituted by a nitride film on the tunnel film and a top oxide film on the nitride film. Another characteristic feature resides in that the thickness of the tunnel film is set to 2.2 nm or more. Although the absolute thickness of the top oxide film changes according to the film quality thereof, from the viewpoint of the amount of transition of the carriers, the top oxide film is set to almost same thickness as the thickness of the tunnel film or the thickness lower than this. Defining this in more detail, the thickness of the top oxide film is set to a thickness that the amount of transition of the carriers passing through the top oxide film is almost equal to or larger than the amount of transition of the carrier passing through the tunnel film.

Preferably, the top oxide film is set to a smaller thickness than the thickness of the tunnel film.

As mentioned above, if the tunnel oxide film is made thick, it becomes difficult to inject charges into the insulation film by a low gate voltage at the time of a read operation. In addition to this, If the top oxide film is made thin, the thickness is adjusted so as to balance intensities of the electric fields applied to the tunnel film in "erased" state and the top oxide film in "written" state at the time of reading data, and It becomes difficult for a read disturbance to occur. Namely, the injected charges are no longer blocked by the thick top oxide film, the rise of the threshold voltage in "erased" state is suppressed, and erroneous writing at the time of a read operation Is prevented.

By these structures, the resistance to read disturbances is improved, so the selection transistors become unnecessary at the time of a read operation and it becomes possible to realize a so-called one-transistor cell.

Further, if the tunnel film is made thicker than the prescribed value (3.4 nm), the write and erase operations become possible within the range of the enhancement type, which is advantageous for a one-transistor cell structure.

BRIEF DESCRIPTION OF THE DRAWINGS

These and other objects and features of the present invention will become clearer from the following description of the preferred embodiments made with reference to the attached drawings, in which.

DESCRIPTION OF THE PREFERRED EMBODIMENTS

Preferred of the present invention will now be explained in detail with reference to the drawings.

Here, an explanation will be made of the embodiment of the present invention by taking as an example a MONOS type nonvolatile memory device as one such MIOS type nonvolatile memory device.

First Embodiment

Figure 1:
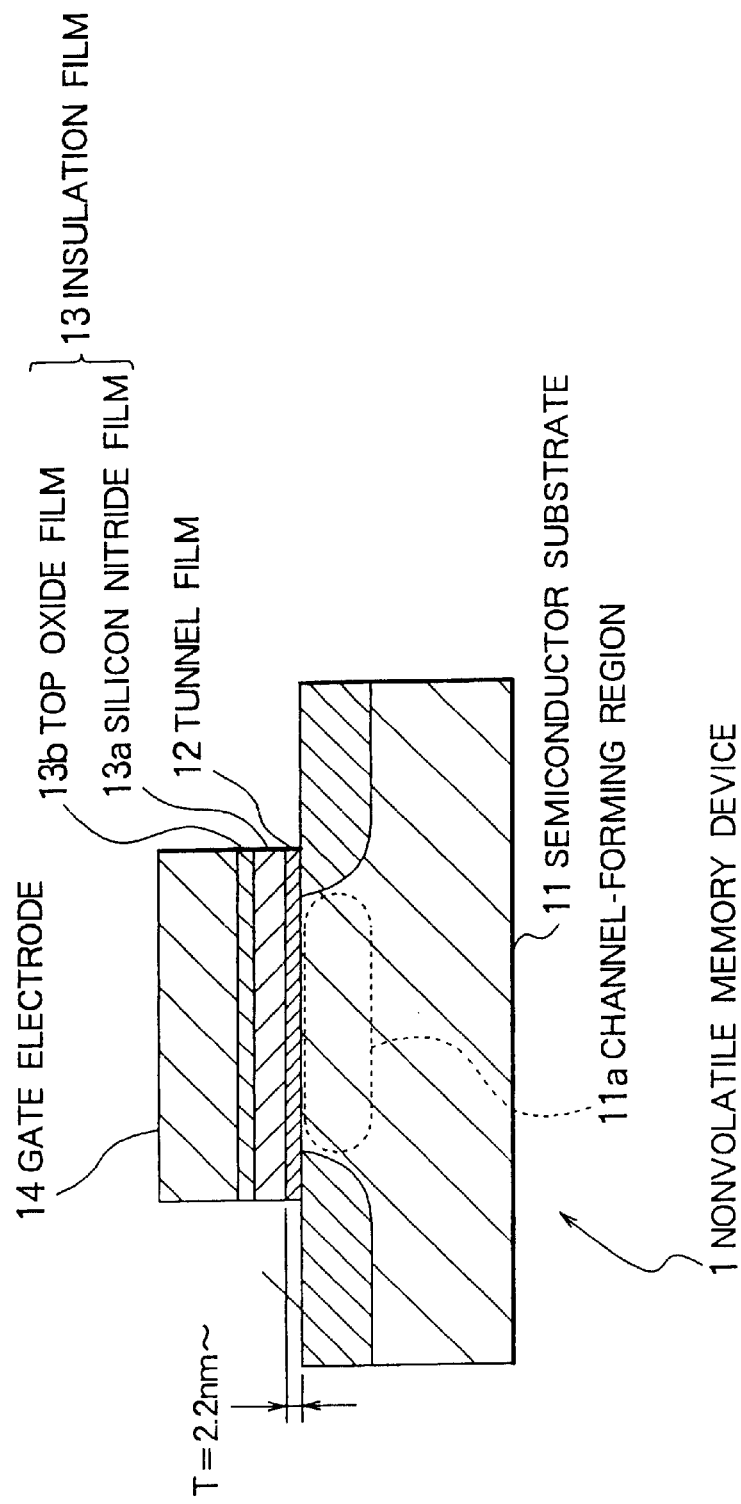
FIG. 1 is a schematic sectional view of a MONOS type nonvolatile memory device according to an embodiment of the present invention.

FIG. 1 is a sectional view of a MONOS type nonvolatile memory device. As shown in FIG. 1, the difference between this nonvolatile memory device 1 and the conventional MONOS type nonvolatile memory device resides in the thickness T of the tunnel film 12 on the channel-forming region 11a as a surface part of the semiconductor substrate. Note that, as apparent from the previously described definition of the channel-forming region, there are also cases where the channel-forming region 11a is formed in the surface of a well or epitaxial layer, semiconductor layer of SOI, or the like.

In a conventional MIOS type nonvolatile memory device, the thickness of the tunnel oxide film was usually set to 1.5 to 2.0 nm. In contrast, the thickness T of the tunnel film 12 of this nonvolatile memory device 1 is set to a range so that the charges in the channel-forming region 11a directly tunnel through the tunnel film 12 and 2.2 nm or more. As a concrete example, when an electric field of 10 MV/cm is applied on this, the thickness of the tunnel film 12 is set within a range of from 2.2 nm to 3.5 nm, preferably set to a thickness making operation possible only in the enhancement type within for example a range of application of the operation voltage. In order to make operation in only the enhancement type possible, desirably a 3.4 nm or more thickness is given to the tunnel film 12.

Note that the tunnel film 12 is made of a silicon oxide or silicon oxi-nitride produced on the surface of the channel-forming region 11a by a thermal oxidation process, a thermal nitridation or plasma nitridation process, or CVD process.

In the nonvolatile memory device 1 of the above structure, the thickness T of the tunnel film 12 is set within a range where the charges in the semiconductor substrate 11 directly tunnel through the tunnel film 12. The charges are injected into the insulation film 13 by a mechanism similar to the conventional one, that is, the modified F-N tunneling, at the time of a write operation. Accordingly, the write characteristic can be maintained similar to the conventional case and, at the same time, a write operation can be carried out without exerting damage upon the tunnel film 12 similar to the conventional case.

Further, since the thickness T of the tunnel film 12 is greater than the conventional MIOS type nonvolatile memory device, i.e., 2.2 nm, this tunnel film 12 acts as a barrier and it becomes difficult for the charges injected in the insulation film to leak into the semiconductor substrate.

Figure 2:
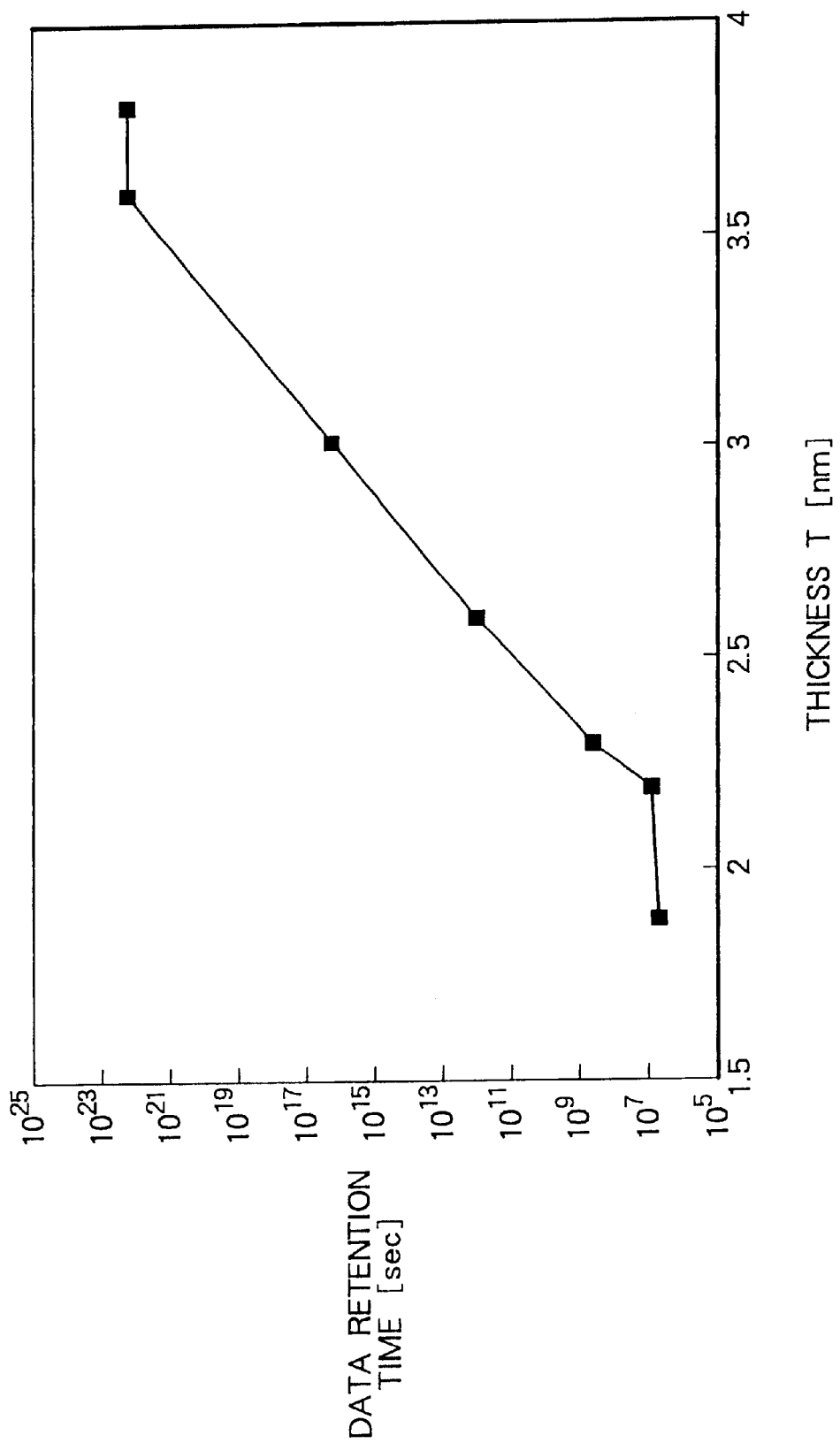
FIG. 2 is a graph showing a retention time of data with respect to the thickness of the tunnel film.

FIG. 2 shows a graph of the data retention characteristic of a nonvolatile memory device 1 with respect to the thickness T of the tunnel film 12. As shown in this graph, it is seen that the data retention time rises depending upon the thickness T of the tunnel film 12 within the range where the thickness T of the tunnel film 12 is 2.2 nm or more. For this reason, as mentioned above, in a nonvolatile memory device 1 in which the thickness T of the tunnel film 12 is set to 2.2 nm or more, the data retention characteristic becomes better than the conventional MIOS type nonvolatile memory device in which the thickness of the tunnel oxide film was set to 1.5 to 2.0 nm.

Further, by making the thickness T of the tunnel film 12 thick as mentioned above, it becomes difficult to inject charges into the insulation film at a low gate voltage at the time of a read operation and thus erroneous writing due to disturbances becomes hard to occur.

Figure 3:
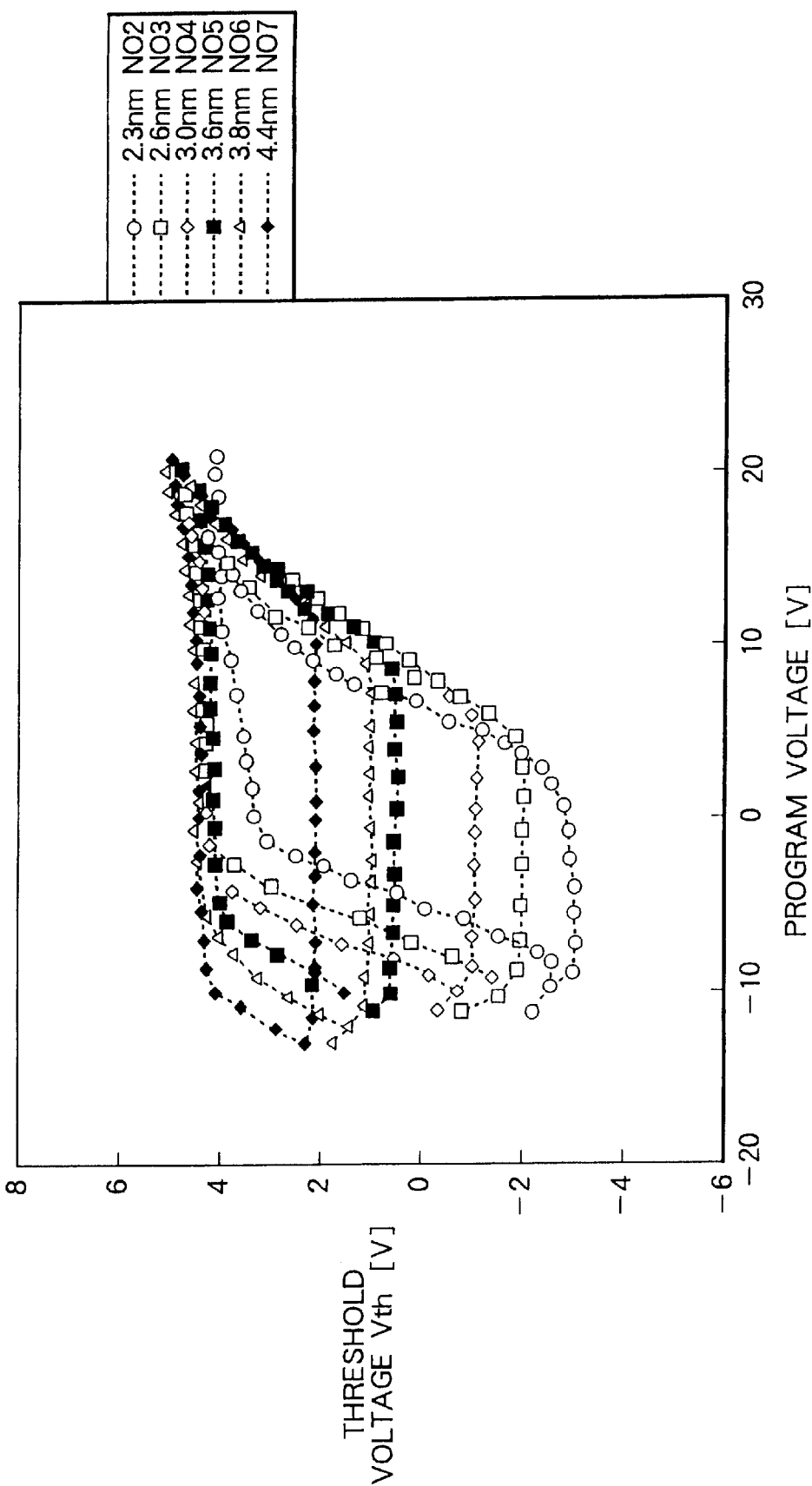
FIG. 3 is a graph showing a hysteresis plotted by changing the tunnel thickness.

Along with this, it becomes difficult to inject holes into the insulation film 13, therefore a memory characteristic with which it is hard in the "erased" state to become a depletion is obtained. FIG. 3 is a graph showing a hysteresis characteristic of a MONOS type nonvolatile memory device for different thicknesses of the tunnel oxide film. Note, in the nonvolatile memory device at this measurement, the silicon nitride film 13a is formed to a thickness of 14 nm while setting the flow rate of an ammonia gas and a dichlorosilane gas to 22 sccm:40 sccm and the top oxide film 13b has a thickness of 4.0 nm. Further, the measurement of the threshold voltage Vth is carried out by setting the time of application of the program voltage Vpp to one second.

As shown in this graph, the threshold voltage on the erasing side shifts to the + side, that is, the enhancement type operation range, when the thickness T of the tunnel film 12 is made thick. Then, regarding the thickness T of the tunnel film 12 in the nonvolatile memory device of the above setting, within a range of 3.4 nm or more found by inserting an experimental value of FIG. 3, it can be read that program control becomes possible only on the enhancement side, that is, within the range where the threshold voltage Vth becomes a plus value.

From the above, operation in only the enhancement type becomes possible, and it becomes unnecessary to provide a control circuit for preventing operation in the depletion type. Along with this, it is not necessary to adopt a circuit structure in which selection transistors are individually provided for every memory element and it becomes possible to constitute circuits such as NOR type, NAND type, and DINOR type circuits. In the present invention, this will be referred to as a one-transistor cell structure. In the one-transistor cell structure, the cell area can be reduced from the conventional one by an amount of the elimination of the selection transistor.

Further, since it becomes difficult to inject holes into the insulation film 13, deterioration of the tunnel film 12 and the silicon nitride film 13a is prevented, and the repetition characteristic of the write and erase operation is improved.

Further, in the MONOS type nonvolatile memory device 1 of the above embodiment, it is also possible to make the content of silicon of the silicon nitride film 13a constituting the insulation film 13, which stores charges, higher than the stoichiometric ratio $Si_3N_4$ (Si:N=3:4).

When adopting such a structure, the trap density of the charges in the insulation film 13 is increased and the conductivity of the insulation film 13 is improved. For this reason, a high electric field is applied by the tunnel film 12 when applying this to the gate and it becomes possible to make the operation voltage low. Further, the amount of the accumulated charges becomes large, and the operation in only the enhancement type becomes easier.

Figure 4A:
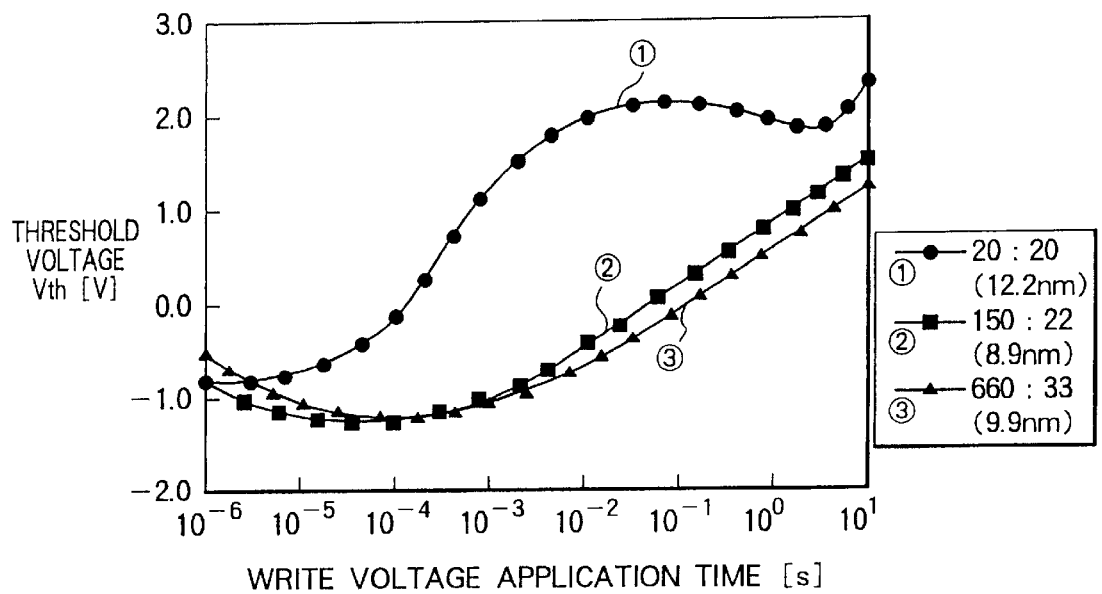
FIGS. 4A and 4B are a view showing a relationship between a voltage application time and a threshold value plotted while changing the composition of the silicon nitride film.
Figure 4B:
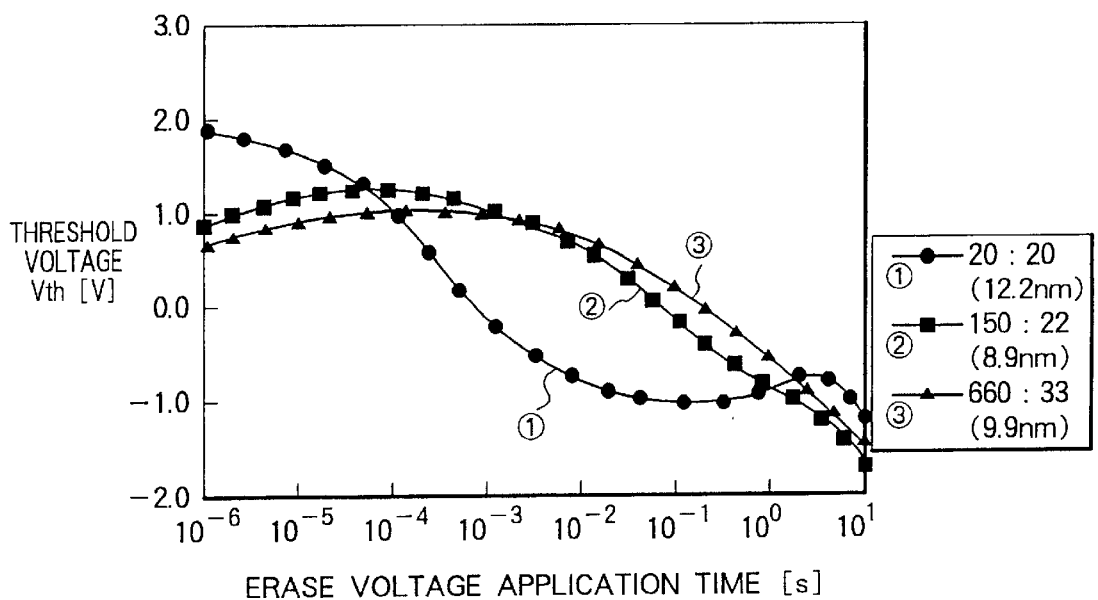

FIGS. 4A and 4B are graphs showing the threshold voltage Vth with respect to the time of application of the voltage of the MONOS type nonvolatile memory device in the case where a low voltage of 6V is applied as the program voltage for different film-forming conditions of an insulation film made of a silicon nitride film. FIG. 4A shows the case of a write operation; and FIG. 4B shows the case of an erase operation.

Each insulation film 13 is formed by a LP-CVD (low-pressure chemical vapor deposition) process, and the flow rate of the reaction gases (ammonia gas $NH_3$ and dichlorosilane $SiH_2Cl_2$:DCS) is changed. At this time, the flow rate of the dichlorosilane is made almost constant, and the flow rate of the ammonia gas is changed.

Note that the substrate temperature at the time of the film formation was set to 680° C. Further, in the nonvolatile memory device for which the measurement was carried out, the tunnel film 12 was set to a thickness of 2.2 nm and the thickness of the top oxide film 13b was set to 4 nm.

The curve (1) in the figure relates to a nonvolatile memory device constituted by forming the silicon nitride film 13a with a reaction gas flow rate ($NH_3$:DCS=20:20) with which silicon nitride having a higher silicon content than the stoichiometric ratio $Si_3N_4$ (Si:N=3:4) is produced. Also, the curve (2) relates to a nonvolatile memory device constituted by forming the silicon nitride film 13a with a reaction gas flow rate ($NH_3$:DCS=150:22) with which the stoichiometric ratio $Si_3N_4$ is produced. Further, the curve (3) relates to a nonvolatile memory device constituted by forming the silicon nitride film 13a with a reaction gas flow rate ($NH_3$:DCS=660:33) with which silicon nitride having a higher nitrogen content than the stoichiometric ratio $Si_3N_4$ is produced.

As shown by these curves (1) to (3), in a write operation, the higher the content of silicon, the shorter the time of application of voltage for a rise of the threshold voltage Vth. In an erase operation, the higher the content of silicon, the shorter the time of falling of the threshold voltage Vth. In addition, along with the increase of content of silicon, an abrupt increase of the threshold voltage Vth is seen. From this, it is seen that the operation at a lower voltage becomes possible by making the content of the silicon in the silicon nitride film 13a constituting the insulation film 13 larger than the stoichiometric ratio.

Further, since the operation voltage is made low as described above, it becomes unnecessary to form the transistor of the program circuit used at the time of a write and erase operation as a high voltage resistant transistor. For this reason, it becomes possible to form the transistor of a logic circuit used at for example the time of a read operation and the transistor of the program circuit in the same step. Along with this, it becomes possible to reduce the number of steps and simultaneously possible to reduce the number of photomasks. Giving one example, the number of masks used for the gate etching, the ion implantation for adjustment of the threshold voltage Vth, and the S/D formation using ion implantation for increasing the drain breakdown voltage of high voltage transistors can be reduced.

Figure 5:
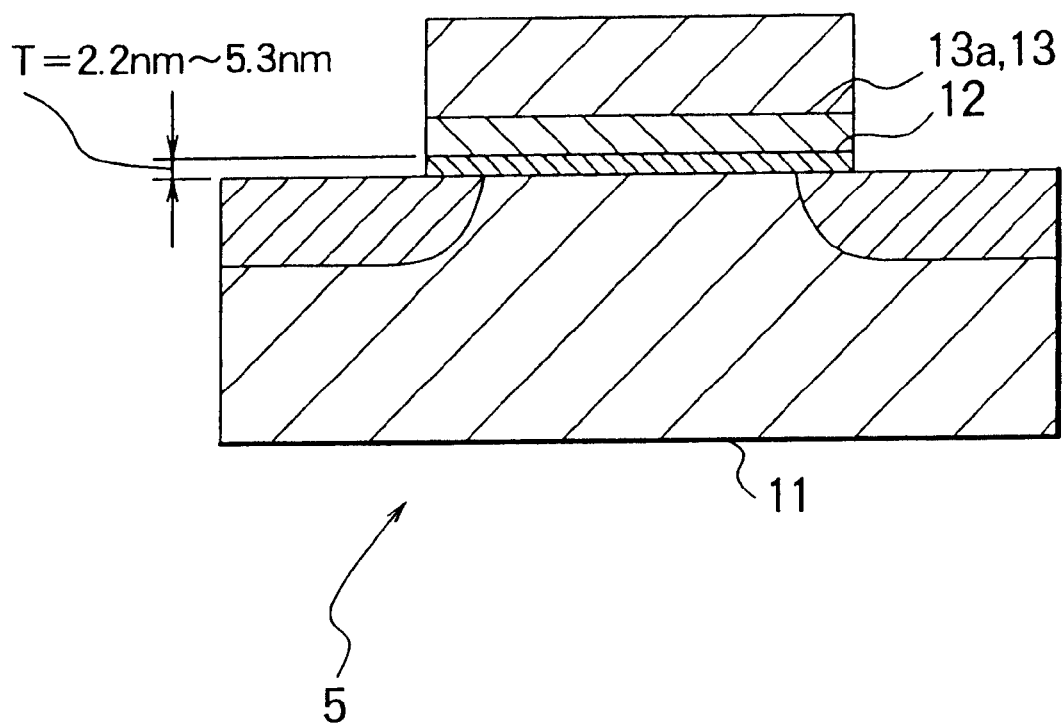
FIG. 5 is a schematic sectional view of a nonvolatile memory device (MNOS type) of another embodiment to which the present invention can be applied.

In the above embodiment, the explanation was made by taking as an example a case where the present invention was applied to the MONOS type nonvolatile memory device 1. However, the present invention can also be applied to an MNOS type nonvolatile memory device 5 as shown in FIG. 5. In this case as well, the thickness T of the tunnel film 12 between the channel-forming region 11a and the insulation film 13 is set similar to the MONOS type nonvolatile memory device 1 of the above embodiment.

Second Embodiment

The present embodiment relates to a MONOS type nonvolatile memory device in which the top oxide film 13b is made thin with the increase of thickness of the tunnel film 12 from the conventional thickness in the first embodiment, and the resistance to read disturbances is improved.

The MONOS type nonvolatile memory device 1 shown in FIG. 1 enables the thickness of the insulation film 13 to be made thinner than that of the MNOS type and minimizes the program voltage Vpp. In the present embodiment, in order to keep the program voltage Vpp the smallest, the thicknesses of the tunnel film 12 and the top oxide film 13b are optimized within a range where the required threshold voltage Vth at the time of a write operation is obtained without much change of the sum of the thicknesses of the two.

Below, problems of the case near the conventional case where the top oxide film 13b is relatively thick, i.e., about 4 nm, and the case where conversely it is thin (here, 0 nm) will be respectively pointed out, then the top oxide film 13b optimized with respect to the tunnel oxide film 12.

Figure 6:
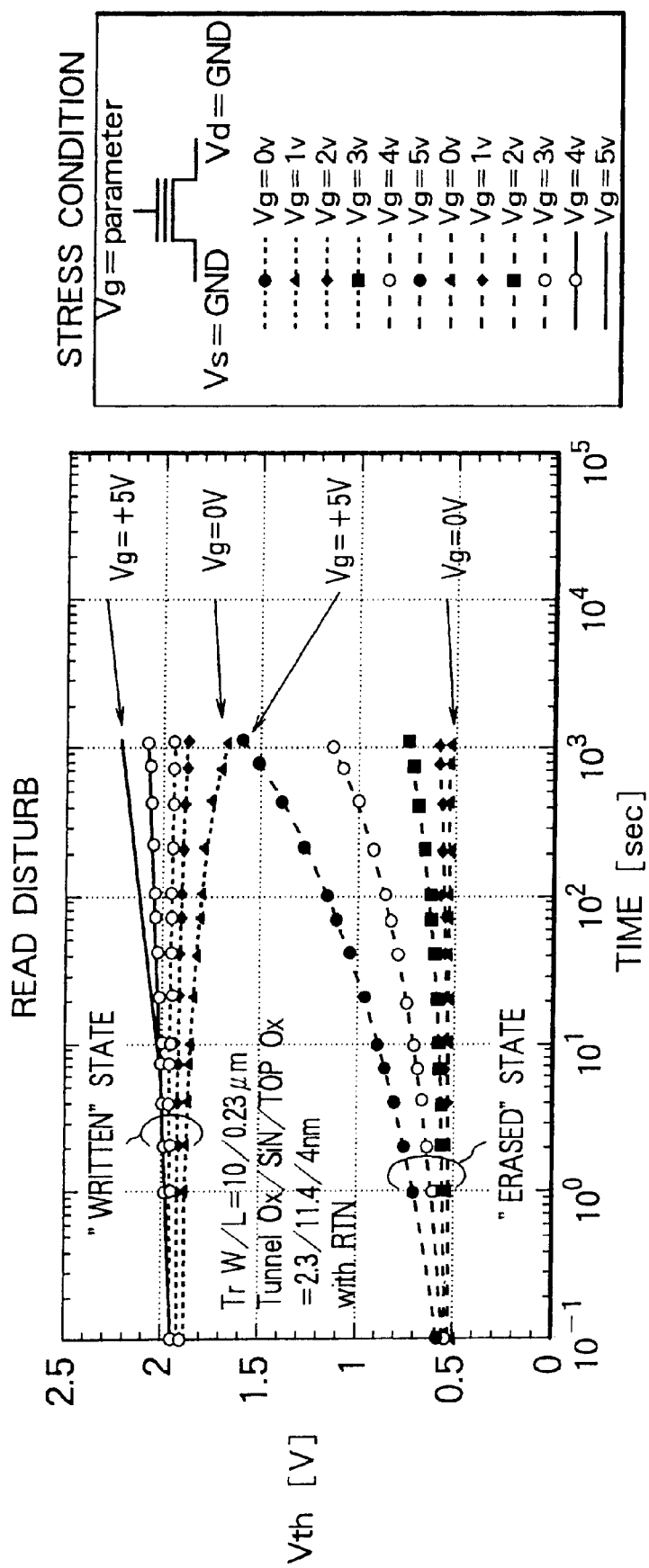
FIG. 6 is a graph showing a resistance to read disturbances when the top oxide film is thick, i.e., 4 nm.

FIG. 6 is a graph showing read disturbances when the top oxide film is relatively thick, i.e., about 4 nm. In the tunnel film 12 here, the thickness thereof is 2.3 nm, i.e., near the point at which the data retention time of FIG. 2 starts to rise and at that thickness (2.3 nm) the data retention exceeds 10 years. As an electric stress conditions, the source and drain are set to GND and the gate voltage Vg is changed from 0V to 5V. Further, RTN (rapid thermal nitridation) is carried out to the tunnel oxide 12 and thus obtained tunnel films are susceptible to the read disturb. Under the conditions, FIG. 6 plots the change of the threshold voltage Vth in the "written" state and the "erased" state along with the elapse of the time of application of the stress.

Vg=0V is the same condition as that at the measurement of the data retention time (FIG. 2). The deterioration has already started on the "written" state side. Further, in actual condition of use, Vg=about 2V when the power supply voltage is 3V. No deterioration at this time is seen. However, if Vg=5V for making the difference clearer, it is seen that the threshold voltage Vth on the "erased" state side greatly rises and the resistance to read disturbances deteriorates.

The rise of the threshold voltage Vth on the "erased" state side is derived from the fact that the top oxide film 13b is thick with respect to the thickness of the tunnel film 12. Namely, if the tunnel film 12 is still thin, i.e., 2.3 nm, and the top oxide film 13b is too thick, i.e., 4 nm, the electric field applied to the tunnel film 12 becomes stronger than that on the top side by an amount of accumulated charges of the positive holes (holes). In the mechanism of rise of the threshold voltage Vth at the time of a read operation of a "erased" state cell where the accumulated charges are holes, first, the accumulated holes drain to the channel-forming region 11a, but almost no holes are injected from the thick top oxide film 13b side. While easily drawn out to the substrate side, the amount of accumulation of the holes in the film is reduced, and as a result, the threshold voltage Vth rises. As described above, if the electric field applied to the tunnel film 12 is larger than the electric field applied to the top oxide film 13b, the discharge of the holes is efficiently carried out, and the read disturbance characteristic deteriorates early as shown in FIG. 6.

The same is true also for the case where the accumulated charges on the "written" state side are electrons, the electric field applied to the top oxide 13b is smaller than the electric field applied to the tunnel film 12 at the time of the read operation, but the accumulated electrons are blocked by the top oxide film 13b and are hardly drawn out, while electrons are efficiently injected from the substrate side via the tunnel film 12 having a thin thickness. As a result, the amount of accumulation of electrons in the insulation film 13 is increased, and the threshold voltage Vth rises.

Figure 7:
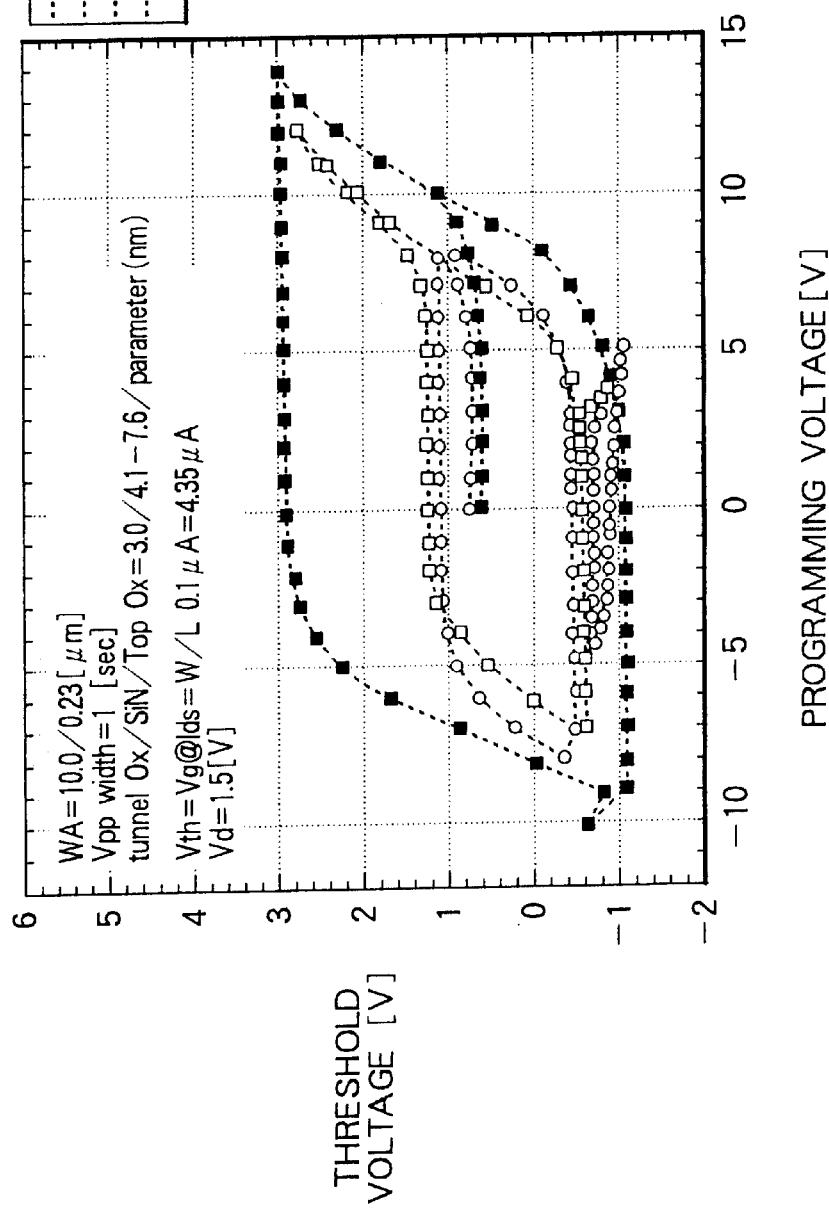
FIG. 7 is a graph showing a hysteresis plotted while changing the top oxide thickness.

The previously explained FIG. 3 showed the hysteresis characteristics plotted for different tunnel thicknesses in the same graph. Contrary to this, FIG. 7 shows the hysteresis characteristics when the thickness of the top oxide film is changed. The tunnel oxide film 12 of the measured samples is slightly thick, i.e., 3.0 nm, and the top oxide film 13b is changed from 6.5 nm to 0 nm. The measurement of the threshold voltage Vth is carried out after applying the program voltage Vpp for one second similar to FIG. 3.

It is seen from this graph that if the thickness of the top oxide film 13b is made thin, the hysteresis curve at the time of a write operation shifts downward in contrast to FIG. 3, and a difference of threshold voltages cannot be secured between a write operation and erase operation. Note, in practical use, it is sufficient so far as the threshold voltage difference is for example 0.5 to 1V, therefore it is seen from this FIG. 7 that there is a problem in the memory characteristic if the top oxide film 13b is eliminated. Also, in order to secure a threshold voltage difference of 0.5 to 2V in practical use, it is seen that the thickness of the top oxide film 13b may be thinner than the conventional 4 nm and in addition it is seen that the program voltage Vpp at that time can be lowered so as to obtain the same threshold voltage difference. Note that, in the case of the MNOS type nonvolatile memory device, the silicon nitride film is made further thick, and a structure with which the memory characteristic can be obtained even if there is no top oxide film is achieved.

The deterioration of the memory characteristic such as the lowering of the maximum threshold voltage difference at the time of programming along with the reduction of thickness of this top oxide film 13b occurs since if the top oxide film 13b is too thin, the electric field applied to the top side becomes strong and the injected electrons drain from the top side along with the rise of the program voltage Vpp.

Also, from the point of the read disturbance characteristic, if the electric field on the top side becomes stronger due to the reduction of thickness of the top oxide film 13b, the electric field on the tunnel film 12 is eased and the read disturbance margin on the "erased" state side is improved, but the read disturbance characteristic on the "written" state side is lowered due to the lowering of the threshold voltage Vth on the "written" state side this time. This point will be shown in the next FIG. 8 and FIG. 9.

Figure 8:
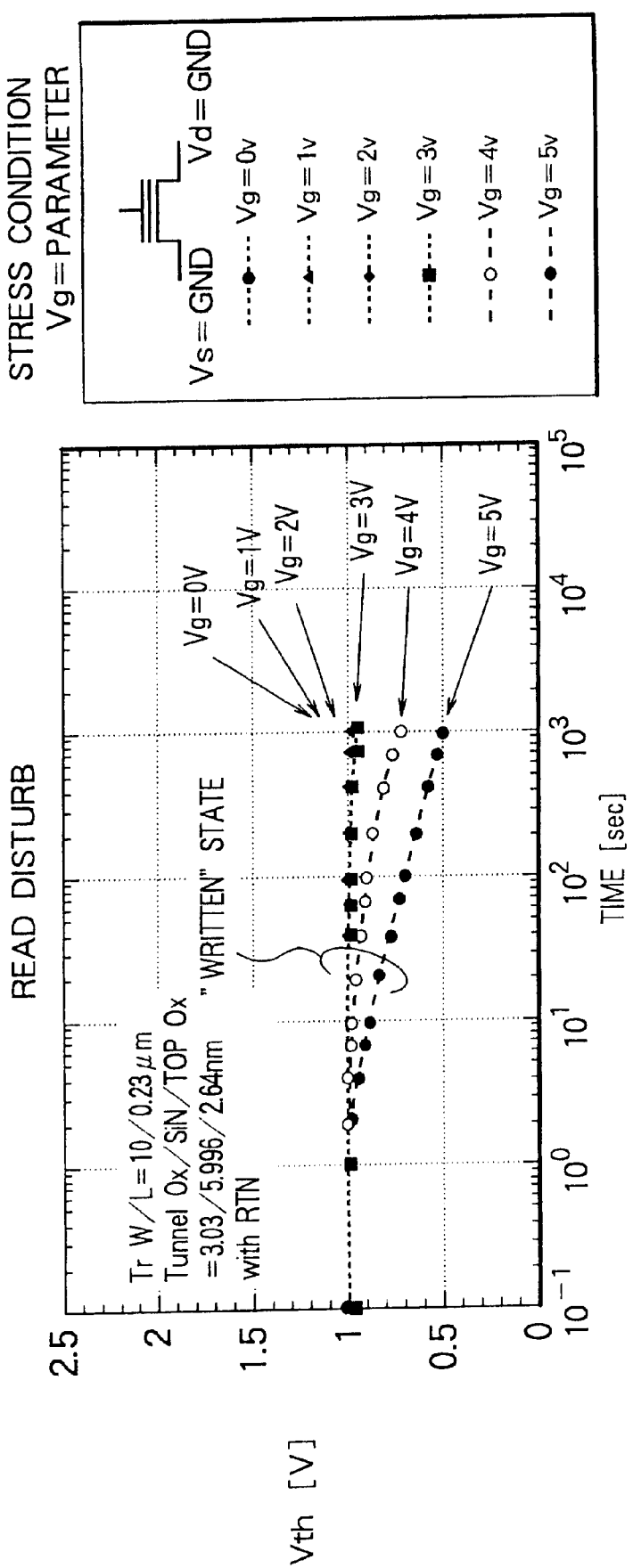
FIG. 8 is a graph showing the resistance to read disturbances in "written" state when the top oxide thickness is near the optimum value with respect to the tunnel thickness.
Figure 9:
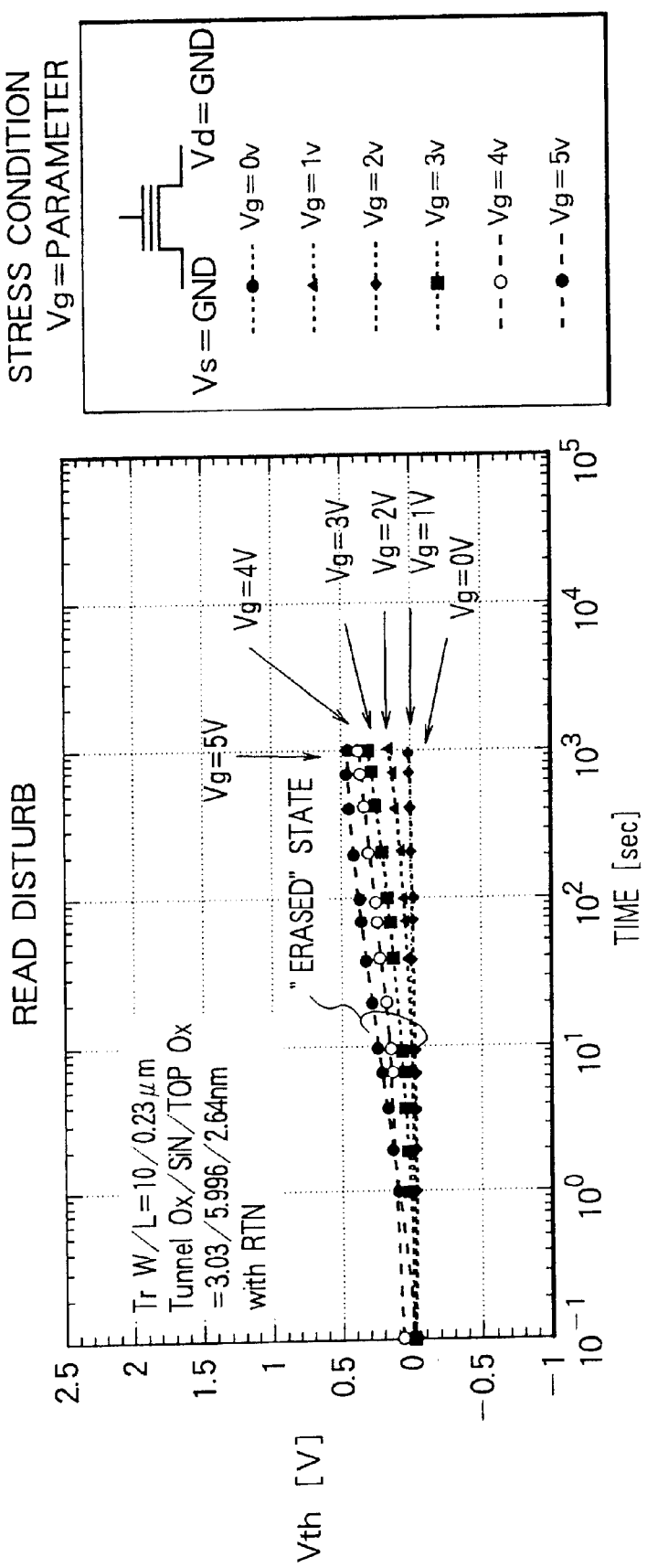
FIG. 9 is a graph showing the resistance to read disturbances in "erased" state when the top oxide thickness is near the optimum value with respect to the tunnel thickness.

FIG. 8 and FIG. 9 are graphs showing the resistance to read disturbances when the top oxide thickness is near the optimum value with respect to the tunnel thickness. Here, FIG. 8 shows the "written" state side; and FIG. 9 shows the "erased" state side. The tunnel film 12 at this measurement is made slightly thick, i.e., 3.03 nm. In contrast with the increase of this thickness, the top oxide film 13b is made thinner than 4 nm of the conventional case and further made thinner than the tunnel film 12, i.e., 2.64 nm. The sum of the two thicknesses is slightly thinner than that of the case of FIG. 6, but not so much changed, and therefore there is no increase of the write voltage. Further, the stress conditions etc. are similar to those of the case of FIG. 6.

If this is compared with FIG. 6 when Vg=5V, the threshold voltage Vth in the "written" state side tends to be lowered, while the rise of the threshold voltage Vth in the "erased" state side is greatly enhanced. Further, by making the tunnel film 12 thicker than that of the case of FIG. 6 and making the threshold voltage Vth in the "written" state side lower than that of the case of FIG. 6 within the range where the practical threshold voltage can be obtained, the data retention in the "written" state side (Vg=0V) becomes better.

Figure 10:
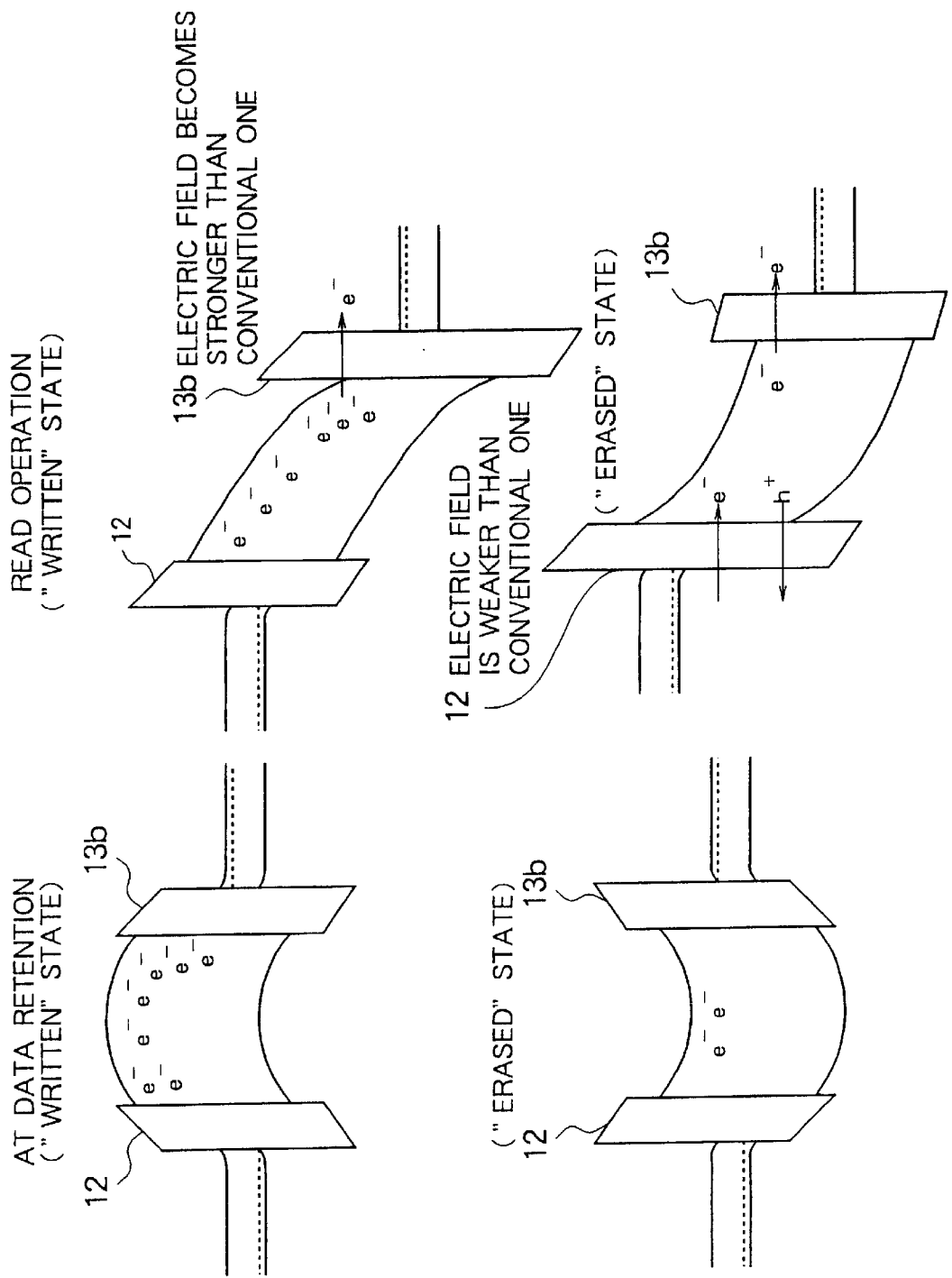
FIG. 10 is a view showing an energy band at the time of data retention and in the read phase in comparison between the "written" state and the "erased" state.
Figure 11:
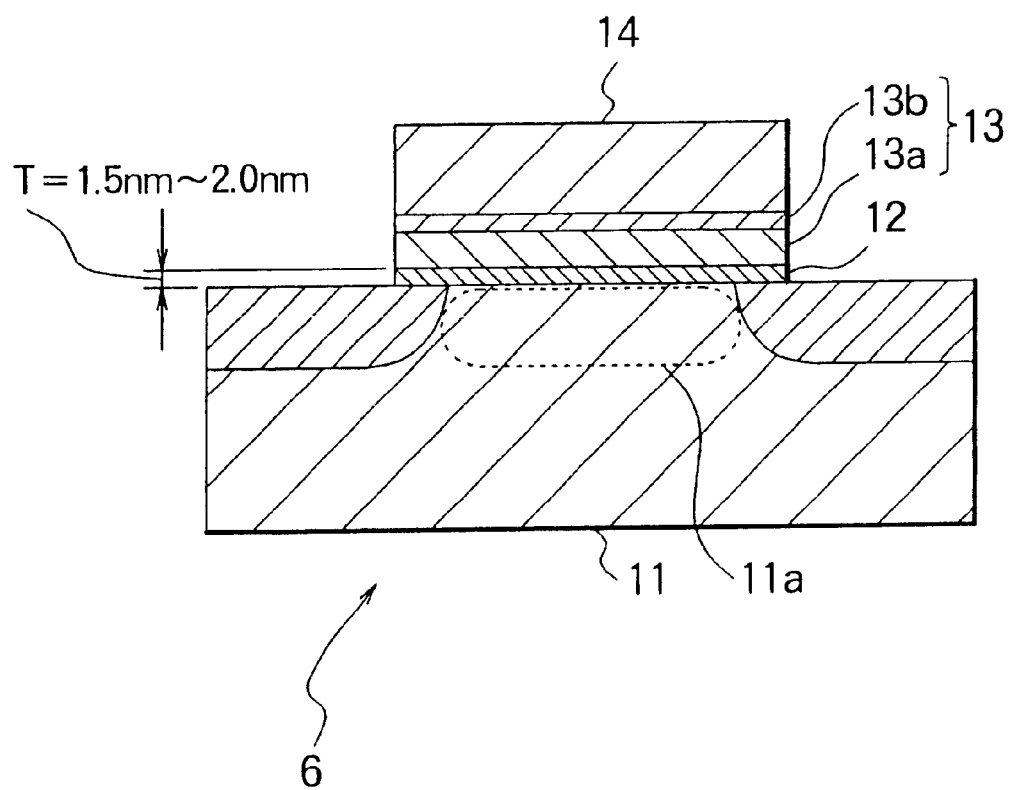
FIG. 11 is a schematic sectional view of a conventional MONOS type nonvolatile memory device.

FIG. 10 is an explanatory view showing energy band diagrams at the time of data retention and in the read operation in comparison between the "written" state side and the "erased" state side. Note that, here, for convenience, an explanation will be made by assuming electrons remained as the charges in the "erased" state.

The optimization of the top oxide film with respect to the tunnel thickness is carried out so as to balance the intensity of the electric field applied to the top oxide film 13b in the "written" state and the intensity of the electric field applied to the tunnel film 12 in the "erased" state as shown in the energy band of the reading state of FIG. 10. Preferably the intensities of the electric fields of the two are made equal, but if the intensities of the electric fields are made closer, an effect that the gate disturbance margin becomes larger by that amount is obtained.

In the "erased" state at this time, the electric field is eased from the conventional one since the tunnel film 12 is made thick, the tunneling effect determined by the height of the barrier potential and the thickness is lowered, the amount of injection of electrons from the substrate into the silicon nitride film 13a at the time of a read operation for the "erased" state is suppressed and the resistance to disturbance is enhanced. At this time, if the thickness of the top oxide film 13b is set thinner than the tunnel film 12 in which the electric field is strong, charges of almost an equal amount to the amount of injected from the channel forming region can be lost to the gate electrode side.

Also, in the "written" state, the electric field becomes stronger than the conventional case since the top oxide film 13b was made thinner than 4 nm and a small amount of electrons escaped to the gate electrode side. The tendency of falling when Vg=5V in FIG. 8 reflects that these accumulated charges drain to the gate electrode side. The data retention time of the device is determined by the characteristic of the one which becomes lower due to the lowering of this threshold voltage or lowering at the data retention at the gate voltage 0V. For this reason, the top oxide film 13b can be made thin until the characteristic at the gate voltage 0V at the writing value matches with the characteristic deterioration at about a gate voltage between "written" state gate threshold voltage and "erased" state gate threshold voltage at actual read operation.

Further, the total thickness of the tunnel film 12 and the top oxide film 13b does not change that much from the conventional thickness, whereby the rise of the program voltage Vpp is suppressed to the lowest limit.

As explained above, according to the nonvolatile memory device of the present invention, by setting the thickness of the tunnel film to a range so that the charges in the semiconductor substrate directly tunnel through the tunnel film and to 2.2 nm or more in an MIOS type nonvolatile memory device, the data retention characteristic is improved from the conventional MIOS type nonvolatile memory device. Along with this, it becomes difficult to inject charges into the insulation film at a low gate voltage at a read operation, so generation of disturbances can be suppressed and it becomes possible to constitute the circuit as single transistor cell array. Accordingly, a reduction of the cell area can be achieved. Further, since the injection of holes is suppressed, the improvement of the repetition characteristic of the write and erase operation is achieved.

Further, in a nonvolatile memory device, in the case where a silicon nitride film having a higher content of silicon than the stoichiometric ratio $Si_3N_4$ (Si:N=3:4) is used for the insulation film, it becomes possible to achieve an improvement of the conductivity of the insulation film and the program voltage can be lowered.

If the top oxide film is made thinner than the conventional 4 nm with the increase of the thickness of the tunnel film, the electric fields applied to the two films can be balanced, the rise of the threshold voltage in the "erased" state can be suppressed, a device resistant to read disturbances can be obtained, and the program voltage can be lowered. Generally, the thickness of the top oxide is made thin so that the transition across the top oxide of the charge carriers stored in the insulation film almost equal or larger than the transition across the tunnel film. At this time, the top oxide film can be made thin within a range where the hysteresis characteristic (change of the threshold voltage) can be sufficiently secured, then the long term variation of the threshold voltage in the "written" state at the gate voltage 0V and the variation of the threshold voltage when the read voltage is applied to the gate coincide.

From the above, it becomes possible to provide a nonvolatile semiconductor memory device in which the data retention characteristic and resistance to read disturbances are improved.

What is claimed is:

1. A nonvolatile one-transistor memory cell comprising:
   a channel-forming region of a semiconductor;
   a tunnel film on said channel forming region;
   an insulation film on said tunnel film; and
   a gate electrode on said insulation film,
   wherein said insulation film includes a nitride film and a top oxide film on said nitride film, the thickness of the tunnel film being within a range where charges in the channel forming region directly tunnel through the tunnel film,
   wherein the insulation film is comprised of a silicon nitride, and the silicon nitride has a higher content of silicon than the stoichiometric ratio $Si_3N_4$ (Si:N—3:4); and
   wherein the thickness of the tunnel film is 3.4 nm or more.

2. A nonvolatile one-transistor memory cell comprising:
   a channel-forming region of a semiconductor;
   a tunnel film on said channel forming region;
   an insulating film on said tunnel film; and
   a gate electrode on said insulation film,
   wherein said insulation film comprising a nitride film and a top oxide film on said nitride film, the thickness of said top oxide film being set to a thickness so that the amount of transition of the carriers passing through the top oxide film is almost equal to or larger than the amount of transition of the carriers passing through the tunnel film under a read voltage applied to said gate electrode.

3. A nonvolatile one-transistor memory cell as set forth in claim 2, wherein the top oxide film is set to a thickness smaller than the thickness of the tunnel film such that the amount of transition of the carriers passing through the top oxide film is almost equal to or larger than the amount of transition of the carriers passing through the tunnel film under a read voltage applied to said gate electrode.

4. A nonvolatile one-transistor memory cell as set forth in claim 2, wherein:

the insulation film is comprised of a silicon nitride; and the silicon nitride has a higher content of silicon than the stoichiometric ratio $Si_3N_4$ (Si:N=3:4).

5. A nonvolatile one-transistor memory cell as set forth in claim 2, wherein the thickness of the tunnel film is 3.4 nm or more.

6. A nonvolatile one-transistor memory cell comprising:

a channel-forming region of a semiconductor;

a tunnel film on said channel forming region, the thickness of the tunnel film being within a range where charges in the channel forming region directly tunnel through the tunnel film and is 2.2 nm or more;

an insulation film on said tunnel film; and a gate electrode on said insulation film, wherein said insulation film comprising a nitride film and a top oxide film on said nitride film, the thickness of said top oxide film being set to a thickness so that the amount of transition of the carriers passing through the top oxide film is almost equal to or larger than the amount of transition of the carriers passing through the tunnel film in a read operation.

7. A nonvolatile one-transistor memory cell as set forth in claim 6, wherein the top oxide film is set to a thickness smaller than the thickness of the tunnel film.

8. A nonvolatile one-transistor memory cell as set forth in claim 6, wherein:

the tunnel film is comprised of nitrided oxide.

* * * * *